United States Patent [19]

Nakamura et al.

[11] 3,997,907
[45] Dec. 14, 1976

[54] LIGHT EMITTING GALLIUM PHOSPHIDE DEVICE

[75] Inventors: Tadao Nakamura; Tetsuo Sadamasa, both of Tokyo; Osamu Abe, Yokohama, all of Japan

[73] Assignee: Tokyo Shibaura Electric Co., Ltd., Kawasaki, Japan

[22] Filed: Jan. 30, 1975

[21] Appl. No.: 545,347

[30] Foreign Application Priority Data

July 8, 1974 Japan .............................. 49-77350
Oct. 23, 1974 Japan .............................. 49-121500

[52] U.S. Cl. .................................. 357/17; 357/16; 357/59; 357/64
[51] Int. Cl.² ........................................ H01L 33/00
[58] Field of Search .................. 357/16, 17, 59, 63, 357/64

[56] References Cited

UNITED STATES PATENTS

| 3,723,201 | 3/1973 | Keil | 357/16 |
|---|---|---|---|
| 3,742,598 | 7/1973 | Nishida | 357/17 |
| 3,743,847 | 7/1973 | Boland | 357/59 |
| 3,821,616 | 6/1974 | Kravitz | 357/17 |
| 3,846,193 | 11/1974 | Jacobus, Jr. et al. | 357/16 |
| 3,912,556 | 10/1975 | Grenon et al. | 357/17 |
| 3,931,631 | 1/1976 | Groves et al. | 357/17 |
| 3,947,840 | 3/1976 | Craford et al. | 357/16 |

*Primary Examiner*—William D. Larkins
*Attorney, Agent, or Firm*—Oblon, Fisher, Spivak, McClelland & Maier

[57] ABSTRACT

A light emitting gallium phosphide device comprising a gallium phosphide (GaP) substrate of one conductivity type and at least one GaP layer of the opposite conductivity type formed on said substrate so as to form a P-N junction, wherein, the GaP layer, when impressed with forward voltage, forms light emitting regions, as viewed from above; and a light absorbing layer prepared from noncrystalline (amorphous) or polycrystalline silicon is mounted on at least one plane selected from the group consisting of the back side of the GaP substrate, those portions of the surface of the GaP substrate on which the GaP layer is not formed and the other portions of the surface of the GaP layer than the light emitting regions thereof, thereby attaining a very favorably acceptable monolithic display in high luminance and distinct contrast.

9 Claims, 17 Drawing Figures

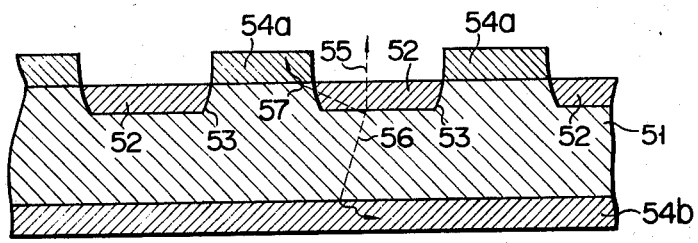
FIG. 5
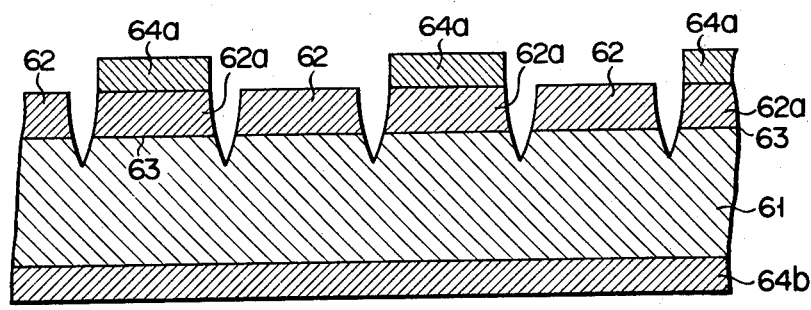
FIG. 6
FIG. 7
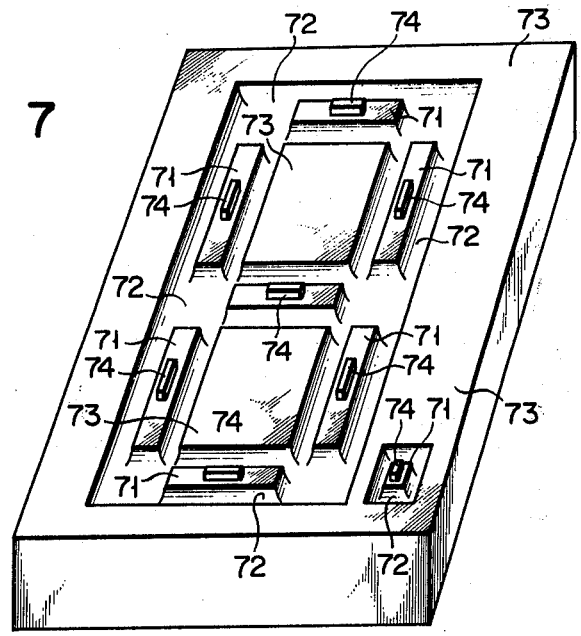

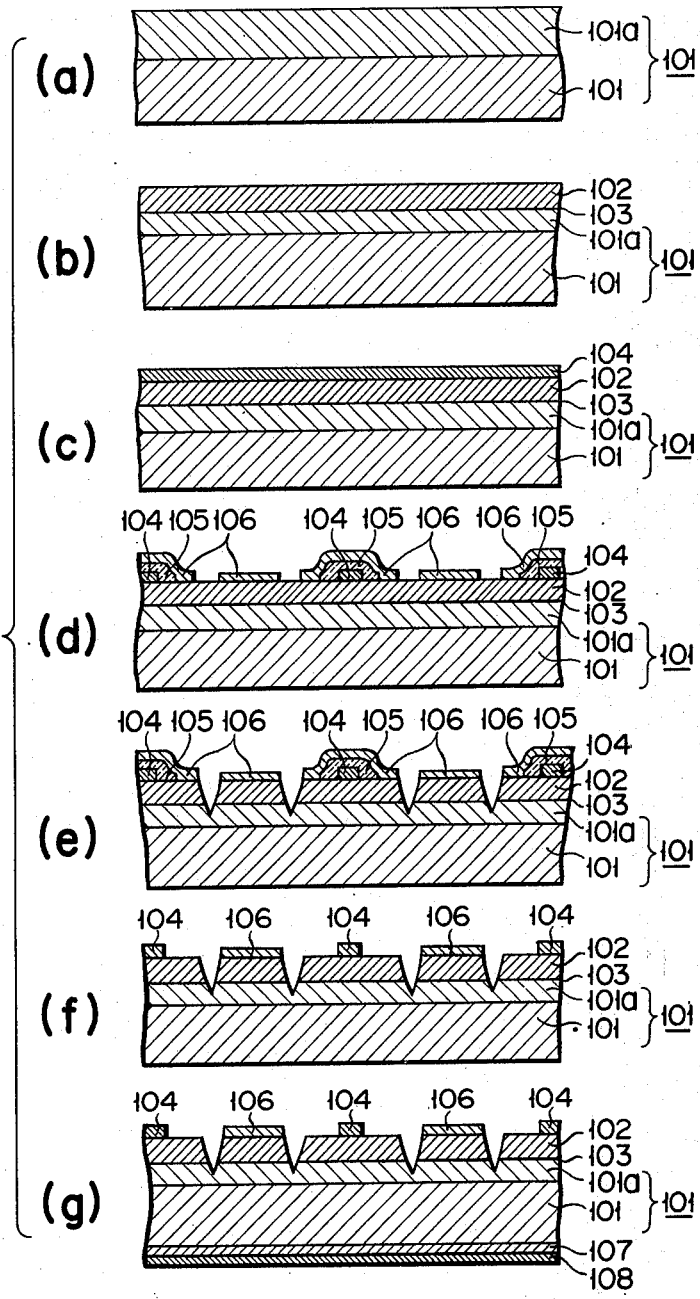

LIGHT EMITTING GALLIUM PHOSPHIDE DEVICE

This invention relates to a light emitting GaP device, and more particularly to the type attaining a very favorably acceptable monolithic display.

The materials of the prior art semiconductor light emitting devices include the crystal of compounds of elements belonging to the III and V groups of the periodic table such as GaP and GaN, the mixed crystals of compounds of elements belonging to the III and V groups such as $GaAs_{1-x}P_x$, the crystal of compounds of elements belonging to the II and VI groups such as ZnTe and the crystal of compounds of elements belonging to the IV group such as SiC. Among the above-listed light emitting devices, the type using the GaP crystal has been most widely accepted, because said crystal emits beams of light ranging from red to green and attains high luminance and external quantum efficiency. A light emitting device comprising said GaP crystal has such a construction as illustrated in FIG. 1. Said GaP crystal emits light in the directions of dotted lines shown therein. A P-type GaP layer 12 is mounted on an N-type GaP substrate 11 by vapor growth, liquid phase epitaxial growth or diffusion so as to form a P-N junction 13. The subsequent selective mesa-etching of said P-type GaP layer 12 provides a light emitting GaP device constructed as shown in FIG. 1. Impression of forward voltage between the N-type GaP substrate 11 and P-type GaP layer 12 causes light to be emitted from the neighborhood of the P-N junction 13, namely, from the P-type GaP layer 12 as observed from above by the human eye. Accordingly, the P-type GaP layer 12 may be designated as a light emitting region, while those portions of the surface of the N-type GaP substrate 11 on which the P-type GaP layer is not mounted and the backside of said substrate 11 may be referred to as non-light emitting regions. Light sent forth from the P-N junction 13 consists of one group 14 of beams which are reflected many times within the GaP crystal constituting the N-type GaP substrate 11 and P-type GaP layer 12 and finally emitted to the outside from the light emitting region, namely, said P-type GaP layer 12 and the other group 15 of beams which are given off directly to the outside from said light emitting region. Since a total amount of said beams 14, 15 is emitted from the P-type GaP layer 12, a monolithic display device having a plurality of properly combined light emitting regions or display segments formed in a GaP substrate can present various light patterns. However, the prior art light emitting GaP device of FIG. 1 had the drawback that light was projected not only from the proper light emitting regions, but also from the non-light emitting regions after reflected many times within the GaP crystal in the directions of dotted lines 16, raising the problem of reducing a contrast between the light emitting and non-light emitting regions, namely, giving rise to an indistinct light pattern. Further disadvantage of the prior art light emitting GaP device was that where an attempt was made to produce a pure green light having a wave length of about 555 nm, it was only possible to obtain a yellowish green light having a wave length of about 565 to 575 nm. The reason is assumed to be that while light emitted from the neighborhood of the P-N junction 13 was reflected many times within the GaP crystal, beams of light having shorter wave lengths were gradually absorbed, causing only beams of light having longer wave lengths to be left.

Another light emitting GaP device of FIG. 2 has been proposed as an attempt to resolve the above-mentioned difficulties as set forth in IEEE TRANSACTIONS ON ELECTRON DEVICES, Volume ED-19, No. 10, pages 1093 to 1097, published in October 1972, particularly in FIG. 2C on page 1094. With the light emitting GaP device of FIG. 2, a P-N junction 13 is formed by depositing a P-type GaP layer 12 on the surface of an N-type GaP substrate 11 as in FIG. 1. Two light absorbing layers 25 consisting of gold-silicon alloy are mounted on the other portions of the N-type GaP substrate than that thereof which faces the P-N junction 13. A light reflecting layer 26 prepared from gold is mounted on that portion of the backside of the N-type GaP substrate which lies between said two light absorbing layers 25 of Au-Si alloy and also on said light absorbing layers 25 themselves. According to the proposed GaP device constructed as shown in FIG. 2, the portions of the light which are emitted downward from the P-N junction 13 are sent forth to the outside from the top of said GaP device by being reflected backward by the light reflecting layer 26 made of gold. Further, the portions of the light which are brought downward from the P-N junction 13 to the light absorbing layers 25 of Au—Si alloy are absorbed in said layers. On the other hand, the portions of the light emitted upward from the P-N junction 13 are directly given off to the outside from the P-type GaP layer 12. As compared with FIG. 1, therefore, the proposed GaP device of FIG. 2 causes light to be less frequently reflected within the GaP crystal and consequently more effectively prevents light from being unnecessarily given off from the other portions than the light emitting P-type GaP layer 12, thereby attaining a more distinct contrast between the light emitting and non-light emitting regions. However, the proposed GaP device of FIG. 2 has been found incapable of providing a sufficiently distinct contrast between the light emitting and non-light emitting regions. The reason is that the light absorbing layers 25 made of Au-Si alloy do not absorb light so effectively as expected, but undesirably allow a considerable amount of light to escape from the non-light emitting regions.

It is accordingly an object of this invention to provide a light emitting GaP device capable of displaying sufficient luminance and presenting a clear light pattern.

Another object of the invention is to provide a GaP device capable of emitting a pure green light.

Still another object of the invention is to provide a GaP monolithic display device attaining a distinct contrast between the light emitting and non-light emitting regions.

A light emitting GaP device according to this invention comprises a GaP substrate of one conductivity type and at least one GaP layer of the opposite conductivity type formed on one side of said substrate so as to form a P-N junction, wherein said GaP layer, when impressed with forward voltage, constitutes a light emitting region as viewed from above, and a light absorbing layer prepared from noncrystalline (amorphous) or polycrystalline silicon is mounted on at least one plane selected from the group consisting of the backside of the GaP substrate, those portions of the surface of the GaP substrate on which the GaP layer is not formed and the other portions of the GaP layer than the light emitting regions thereof. Accordingly, the light emitting GaP device of this invention is very favorably accepted for a monolithic display. As used with the GaP device of the invention, the light absorbing layer of non-crystalline or polycrystalline silicon is preferably chosen to have a thickness of 0.3 to 2.0 μm.

This invention can be more fully understood from the following detailed description when taken in conjunction with the accompanying drawings, in which:

FIG. 5 is a cross sectional view of a light emitting GaP device according to another embodiment of the invention;

FIG. 6 is a cross sectional view of a light emitting GaP device according to still another embodiment of the invention;

FIG. 7 is an oblique view of a monolithic numerical display apparatus using the GaP device of FIG. 6;

FIGS. 11(a) to 11(g) are cross sectional views of the GaP device of the invention showing the sequential steps of manufacturing the same.

Figure 1:
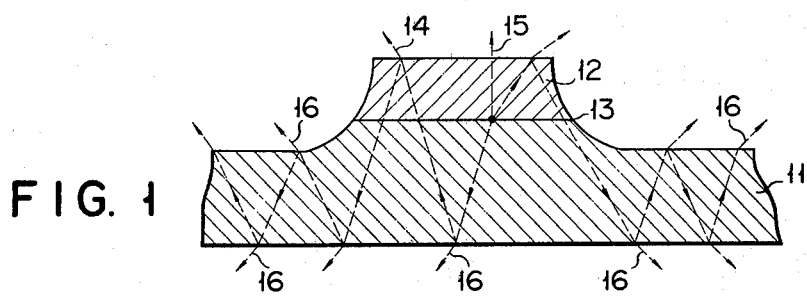
FIGS. 1 and 2 are cross sectional views of the prior art light emitting GaP devices.
Figure 2:
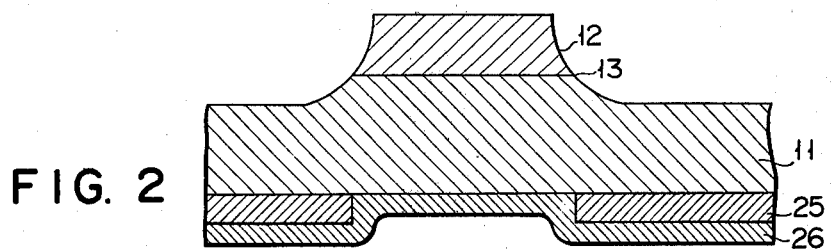
Figure 3:
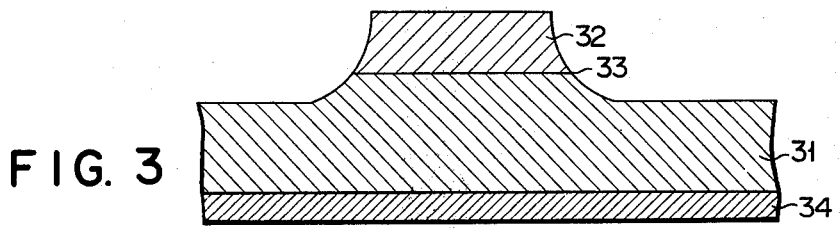
FIG. 3 is a cross sectional view of a light emitting GaP device according to an embodiment of this invention.
Figure 4:
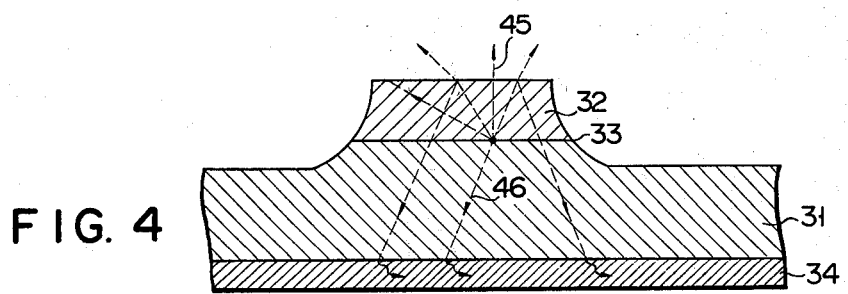
FIG. 4 is a cross sectional view of the subject GaP device, showing the directions of light emitted from the P-N junction.

There will now be described by reference to FIGS. 3 and 4 a light emitting GaP device according to an embodiment of this invention. Referring to FIG. 3, referential numeral 31 denotes an N-type GaP substrate containing nitrogen (N) and an N-type impurity such as tellurium (Te). After zinc (Zn) is diffused in the surface of the GaP substrate 31 to provide a P-N junction 33, a P-type GaP layer 32 is formed by mesa-etching technique. A silicon layer 34 is evaporated all over the backside of the GaP substrate 31. The silicon layer 34 is noncrystalline at this time, but may be later changed into a polycrystalline form when treated at a higher temperature than 500° C for long time. When impressed with forward voltage, the P-type GaP layer 32 acts as a green light emitting region. It has been experimentally discovered for the first time by the present inventors that where forward voltage is impressed between the N-type substrate 31 and the P-type GaP layer 32, then the above-mentioned silicon layer 34 has a prominent property of absorbing light given off from the proximity of the P-N junction 33. FIG. 4 shows the traveling directions of light in the GaP device of FIG. 3 according to this invention. Parts of FIG. 4 the same as those of FIG. 3 are denoted by the same numerals. As apparent from FIG. 4, the beams 45 sent forth upward from the P-N junction 33 proceed straightway from the P-type GaP layer 32 to the outside, while the downward directed beams 46 are absorbed in the silicon layer 34. Therefore, light emitted from the P-N junction 33 is prevented from being reflected many times within the GaP crystal constituting the N-type GaP substrate 31 and P-type GaP layer 32 and being given off from those portions of the surface of said substrate 31 on which the P-type GaP layer 32 is not formed, thereby attaining a more distinct contrast between the light emitting and non-light emitting regions and a clear light pattern. Further, the light emitting GaP device of this invention is saved from the drawback accompanying the prior art similar GaP device that while light is frequently reflected within the GaP crystal, beams having shorter wave lengths are gradually absorbed and those having longer wave lengths only are retained. For instance, the GaP device of FIG. 3 according to this invention can produce a pure green light having a wave length of about 555 nm.

The above-mentioned prominent effect derived from application of the light-absorbing silicon layer 34 is supposed to originate with the fact that noncrystalline or polycrystalline silicon has substantially the similar refractive index as the GaP crystal and suppresses reflection of light in the interface between said silicon and the GaP substrate as is the case with metals such as gold, molybdenum and titanium and black-colored resins when they are mounted on the GaP substrate, and that the noncrystalline or polycrystalline silicon originally has a property of effectively absorbing light, and never allows it to escape again, once it is introduced into said silicon layer. Further advantages of noncrystalline or polycrystalline silicon used as a light absorbing layer with the GaP device of this invention are that since the silicon is a semiconductor like the GaP crystal, it has approximately the similar thermal expansion coefficient as the GaP crystal, attaining easier adhesion thereto than resins, and that the noncrystalline or polycrystalline silicon establishes good ohmic contact with the GaP crystal, admitting of concurrent application as an electrode.

The problem probably raised by application of the noncrystalline or polycrystalline silicon is the assumption that absorption of light by said silicon might reduce the external quantam efficiency and consequently the luminance of the light emitting regions. With the GaP device of this invention, however, light is sent forth only from the light emitting regions and does not substantially leak from the non-light emitting regions, providing a distinct contrast between the light emitting and non-light emitting regions. Moreover, the light emitting regions of the subject GaP device can display such luminance as is substantially little inferior to that of the prior art GaP device. The above-mentioned distinct contrast enables the observer to recognize a very clear light pattern. For example, with the prior art GaP device, the maximum luminance of the light emitting regions and the possible leak of light from the non-light emitting regions have a contrast ratio of 10 to 1 as numerically measured from the light intensities emitted at both regions, whereas, with the GaP device of this invention, said contrast ratio is prominently elevated to 100 to 1. With the luminance of the light emitting region of the prior art GaP device taken as 100, that of the subject GaP device indicates a value ranging between 80 and 90, presenting no considerable difference.

There will now be described by reference to FIG. 5 a light emitting GaP device according to another embodiment of this invention. FIG. 5 is a cross sectional view of said device, showing its construction and the traveling directions of light therein. According to this embodiment, zinc (Zn) is selectively diffused in the surface of an N-type GaP substrate 51 containing tellurium and nitrogen to form a plurality of P-type GaP layers 52, thereby providing a plurality of P-N junctions 53. Light absorbing layers 54a, 54b prepared from noncrystalline or polycrystalline silicon are respectively deposited on the backside of the N-type GaP substrate 51 and those portions of the surface of said substrate 51 on which the P-type GaP layers 52 are not formed. When forward voltage is impressed between the N-type GaP substrate 51 and the P-type GaP layers 52, then these P-type GaP layers 52 act as green light emitting regions as viewed from above. The other portions of the surface of the GaP substrate 51 then said P-type GaP layers 52 constitute non-light emitting regions.

Beams of light 55 emitted upward from the P-N junctions 53 are given off straightway from the P-type GaP layers 52 to the outside, while beams of light 56 downward directed from said P-N junctions 53 are absorbed in the light absorbing layer 54b. Beams of light 57 sent forth obliquely upward from the P-N junctions 53 are also absorbed in the silicon layers 54a deposited on those portions of the surface of the N-type GaP substrate 51 on which the P-type GaP layers 52 are not formed. These light absorbing layers 54a, 54b absorb not only light given off from within the GaP device, but also light brought thereinto from the outside, thereby enabling the embodiment of FIG. 5 to have as large a contrast ratio as 200 to 1 even in a considerably illuminated room due to better protection from the effect of external light than the embodiment of FIG. 3.

There will now be described by reference to FIG. 6 a light emitting monolithic GaP device according to still another embodiment of this invention. Zinc is diffused in the upper portion of an N-type GaP substrate 61 doped with tellurium and nitrogen to form a P-type GaP layer 62, thereby providing a P-N junction 63. The P-type GaP layer 62 is divided into a plurality of regions by mesa-etching technique. A noncrystalline or polycrystalline silicon layer 64a is deposited on the alternate ones of said divided regions. A similar silicon layer 64b is also mounted all over the backside of the N-type GaP substrate 61. Where forward voltage is impressed on those of the divided regions of the P-type GaP layer 62 on which said silicon layer 64a is not mounted, then said voltage-impressed regions of the P-type GaP layer 62 send forth a green light as viewed from above. In contrast, the other divided portions 62a of said P-type GaP layer 62 which are covered with the silicon layer 64a constitute non-light emitting regions due to non-impression of forward voltage. FIG. 7 shows a monolithic numerical display apparatus using the light emitting GaP device of FIG. 6. In this case the light emitting regions are referred to as display segments. The display apparatus of FIG. 7 comprises seven light-emitting segments denoted by the corresponding referential numerals. Referential numeral 71 indicates light emitting segments corresponding to the exposed divided regions of the P-type Gap layers 62 of FIG. 6; referential numeral 72 shows the cavities by which the exposed divided regions of the P-type GaP layer 62 and the silicon-covered divided regions 62a thereof are separated from each other; referential numeral 73 represents the non-light emitting divided regions 62a which are covered with the silicon layer 64a of FIG. 6; and referential numeral 74 denotes the electrodes of some of the display segments through which forward voltage is impressed on the exposed divided regions of the P-type GaP layer 62. Impression of voltage on the selected ones of said seven display segments visibly presents any of the ten digits 0 to 9. Measurement of the luminance of the segments of the monolithic display apparatus of FIG. 7 showed that where current was introduced at the rate of 2 A/cm$^2$, the luminance obtained amounted to around 100 fL (foot Lambert), further attaining a distinct contrast without any blurring of a light pattern. The reason is that all other beams of light than those given off upward from the voltage-impressed display segments are taken in the light absorbing noncrystalline or polycrystalline silicon layer 64b mounted all over the backside of the N-type GaP substrate 61. Comparative experiments with the prior art monolithic display apparatus whose non-light emitting regions were not provided with the noncrystalline or polycrystalline silicon layer of this invention showed that the segments of said monolithic display apparatus produced a luminance of about 120 fL for current introduced at the rate of 2 A/cm$^2$, but that a contrast between the light emitting and non-light emitting regions was indistinct, resulting in the failure clearly to recognize the outline of a presented numeral.

Figure 8:
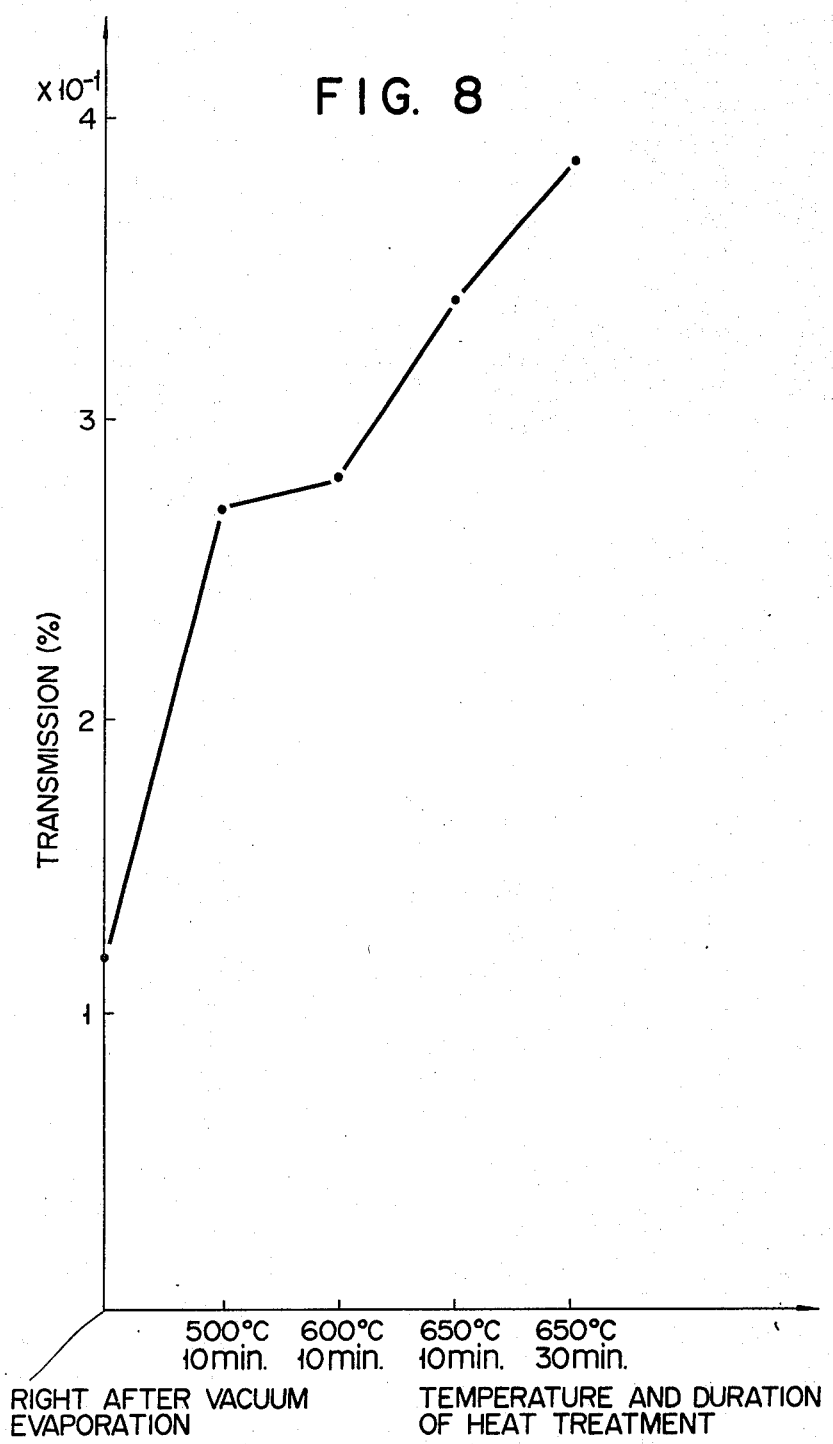
FIGS. 8 to 10 are graphs indicating the properties or functions of noncrystalline or polycrystalline silicon constituting a light absorbing layer in the GaP device of the invention.
Figure 9:
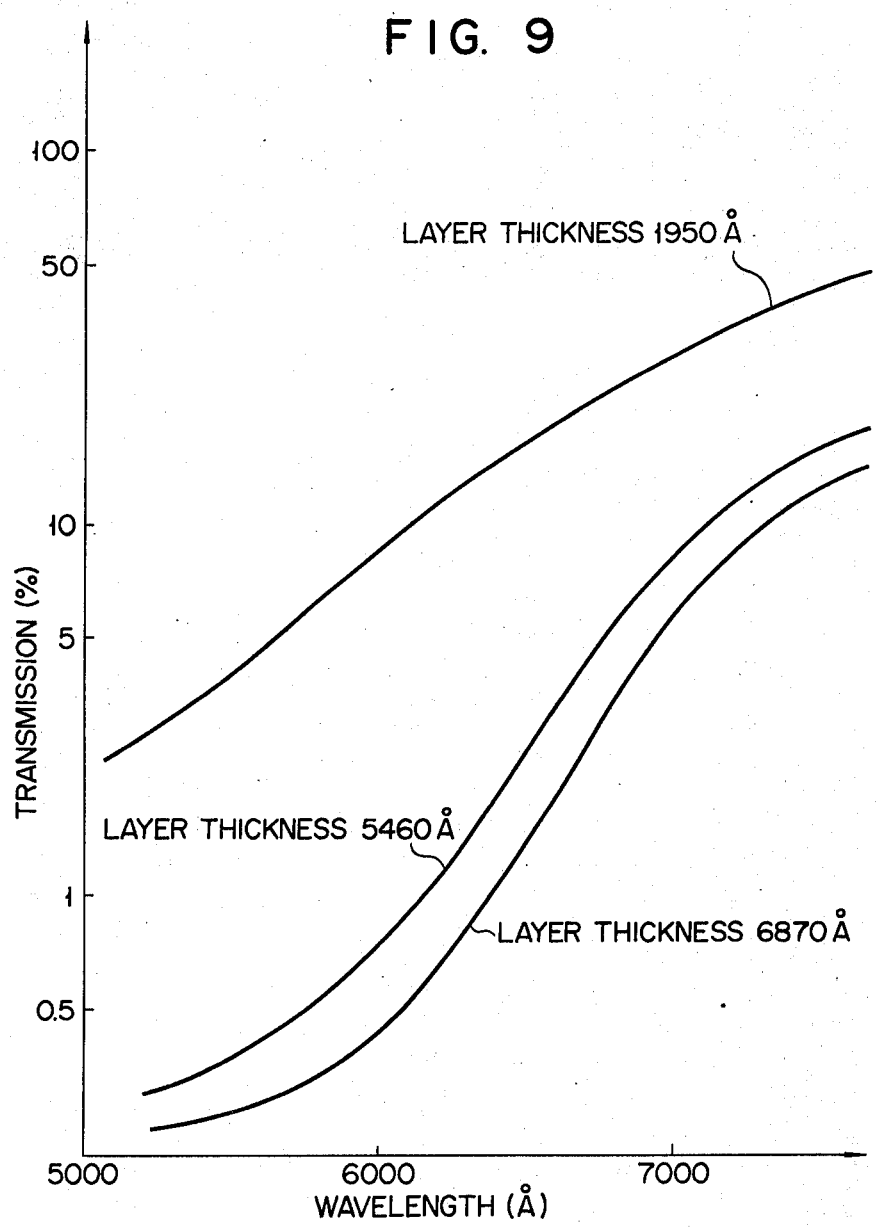

There will now be detailed by reference to FIGS. 8 to 10 the characteristics of the noncrystalline or polycrystalline silicon acting as a light absorbing layer which is used with the light emitting GaP device of this invention and the advantages derived from application of said silicon. Silicon, particularly, the noncrystalline or polycrystalline type has a large light absorption coefficient. FIG. 8 sets forth the measured values of light transmission of a noncrystalline or polycrystalline silicon layer vacuum evaporated to a thickness of 8000 A on a GaP substrate kept at a temperature of 200° C, followed by ordinary heat treatment of a light emitting GaP device itself to attain desired light emission. In this case, the silicon layer having a small light permeability right after vacuum evaporation slightly increases in light permeability as the heat treatment temperature rises. Even where, however, heat treatment is carried out 10 minutes at a temperature of, for example, 500° C, the silicon indicates such light permeability as is only twice larger at most than that occurring right after vacuum evaporation. Therefore, the noncrystalline or polycrystalline silicon does not appreciably decrease in the light absorbing function. Measurement was also made of degree in which the light permeability of the silicon layer varied with its thickness and the wave lengths of light beams passed therethrough, the results being set forth in FIG. 9. As apparent from this FIG. 9, a light absorbing silicon layer over 3000 A thick is little transmissible, particularly to a green light having a wave length of 5550 to 5600 A, namely, absorbs said green light within itself.

Moreover, the noncrystalline or polycrystalline silicon has a refractive index approximating that of the GaP crystal, offering the advantage of suppressing light reflection in the interface between said silicon layer and the GaP control as is generally observed in the interface between said GaP crystal and metals such as titanium, molybdenum and gold when they are mounted on said GaP crystal. The silicon having substantially the similar thermal expansion coefficient as the GaP crystal can be easily adhered thereto, and consequently applied as a mask in the mesa-etching of the GaP crystal layer, thus facilitating the process of manufacturing a light emitting GaP device. Where mixed with impurities, the silicon is also available as a good ohmic electrode. Further, the silicon can be more easily etched than plastics and manufactured with high reproducibility.

The noncrystalline or polycrystalline silicon layer used with the light emitting GaP device of this invention also absorbs external light, attaining an elevated contrast between the light emitting and light absorbing regions even in illuminated room. An alloy, for example, of gold-silicon has a larger reflectivity to general light, rendering said contrast less satisfactory than the silicon itself used with this invention.

Figure 10:
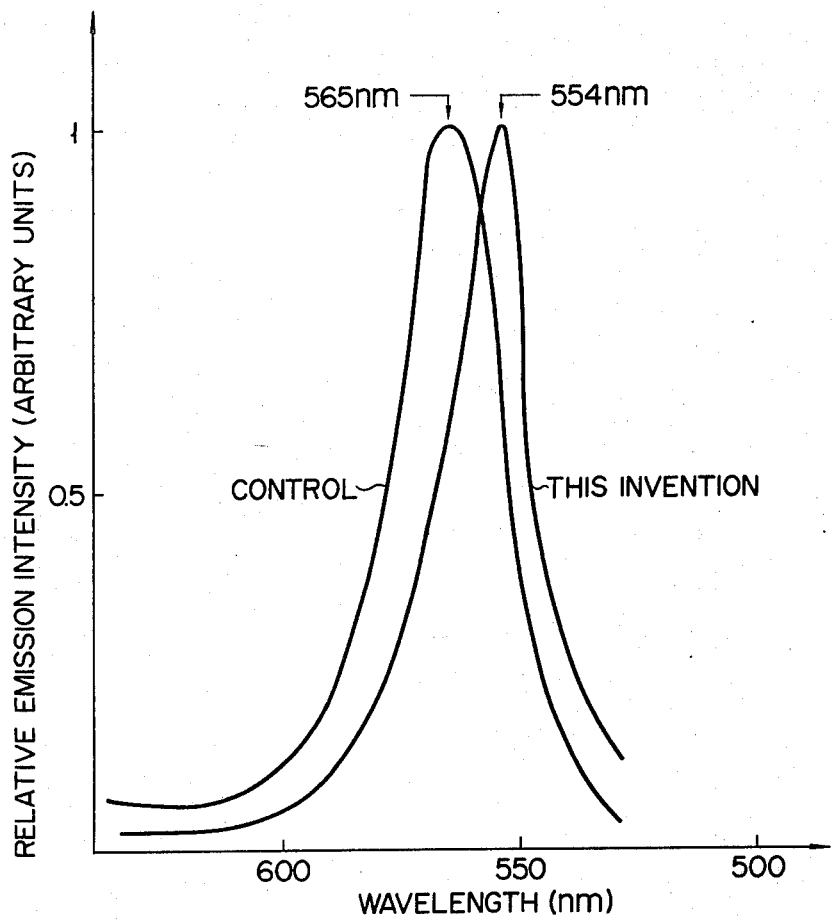

FIG. 10 is a graphic representation comparing the emission spectrum of a light emitting GaP device of this invention provided, as shown in FIG. 6, with a noncrystalline or polycrystalline silicon layer and the emission spectrum of a control or a GaP device from which the silicon layer is omitted. As seen from FIG. 10, the GaP device of this invention emits a pure green light presenting a peak relative emission intensity at a wave length of 554 nm, whereas the control produces a yellowish green light indicating a peak relative emission intensity at a wave length of 565 nm.

Where a contrast between the light emitting and non-light emitting regions was compared between the GaP device of this invention provided with a light absorbing non-crystalline or polycrystalline silicon layer and another type of GaP device using a light absorbing Au—Si alloy layer, then the latter type of GaP device indicated a contrast ratio of only 10 to 1, whereas the subject GaP device having a non-crystalline or polycrystalline silicon layer mounted only on the backside of the N-type GaP substrate attained as large a contrast ratio as 100 to 1. Even where left open to external light, the light emitting GaP device of this invention shown in FIG. 6 presented as large a contrast ratio as 200 to 1.

There will now be described by way of example with reference to FIGS. 11(a) to 11(g) the sequential steps of manufacturing the light emitting GaP device of this invention shown in FIG. 6. First there is provided an N-type GaP crystal layer 101 doped with tellurium. Another N-type GaP crystal layer 101a doped with tellurium and nitrogen is laminated by liquid phase epitaxial growth on the first mentioned N-type GaP crystal layer 101, thereby forming an N-type GaP substrate 101 (FIG. 11(a)). Zinc is diffused in the upper portion of said N-type GaP substrate 101 to form a P-type GaP layer 102, thereby providing a P-N junction 103 (FIG. 11(b)). A metal layer 104 prepared from gold-beryllium alloy and gold is evaporated on the P-type GaP layer 102 to act as an electrode therefor (FIG. 11(c)). The metal layer 104 is selectively etched. A phosphorous-doped silicon dioxide, namely, phospho-silicate glass (PSG) layer 105 is deposited. The other portions of the PSG layer 105 than those covering the metal layer 104 are selectively etched off. Formation of said PSG layer 105 is intended to prevent the later described noncrystalline silicon layer 106 from being alloyed with the metal layer 104. Said noncrystalline silicon layer 106 is evaporated, followed by selective etching to remove unnecessary portions thereof (FIG. 11(d)). The P-type GaP layer 102 is subjected to mesa-etching with the noncrystalline silicon layer 106 used as a mask (FIG. 11(e)). followed by etching to remove all the PSG layer 105 and the unnecessary portions of the noncrystalline silicon layer 106 (FIG. 11(f)). Another noncrystalline silicon layer 107 is mounted all over the backside of the N-type GaP substrate 101. Laminated on said silicon layer 107 is a metal electrode layer 108 consisting of gold-silicon alloy and gold (FIG. 11(g)). The above-mentioned sequential steps provide a light emitting monolithic type GaP device wherein a noncrystalline silicon layer is deposited on the other portions of the P-type GaP layer 102 than the light emitting regions thereof and the backside of the N-type GaP substrate 101. The GaP device obtained at the step of FIG. 11(g) corresponds to the similar device of FIG. 6 to which the metal electrode layer 198 is additionally fitted. The manufacturing method illustrated in FIG. 11 is characterized in that noncrystalline silicon layer 106 is used as a mesa-etching mask. The reason is that silicon has strong chemical resistance to an etching solution (for example, hot aqua regia) and is favorably accepted as a mask. Therefore, the silicon used with the GaP device of this invention which concurrently acts as light absorbing and masking material considerably simplifies the manufacturing process of said GaP device.

Now brief description is given of the method of preparing a light emitting planar type GaP device shown in FIG. 5. First zinc is selectively diffused in the upper portion of the N-type GaP substrate 51 to form a plurality of P-type GaP regions 52. A mask used in the diffusion of zinc may consist of phospho-silicate glass (PSG), alumina ($Al_2O_3$) or silicon nitride ($Si_3N_4$). A noncrystalline or polycrystalline silicon layer 54a is mounted on those portions of the N-type GaP substrate 51 on which the P-type GaP layer 52 is not formed, namely, those portions of said substrate 51 which are defined between the adjacent P-type layers 52. Another noncrystalline or polycrystalline silicon layer 54b is deposited all over the backside of the N-type GaP substrate 51. These steps provide the GaP device of FIG. 5. Last, electrode layers (not shown) are formed on the P-type GaP layers 52 as well as on the silicon layer 54b mounted on the backside of the N-type GaP substrate 51.

Reverting now to the manufacturing process of FIG. 11, the metal electrode layers 104 were formed before the noncrystalline silicon layers 106 were deposited on the surface of the N-type GaP substrate 101. However, this process may be reversed. Further in FIG. 11, the N-type Gap substrate 101 was prepared by forming an N-type GaP layer 101a on the GaP crystal 101 by liquid phase epitaxial growth. However, it is possible to use the GaP crystal 101 itself as a substrate 101 and laminate the P-type GaP layer 102 on said substrate. It is also possible to deposit the N-type GaP layer 101a on the GaP crystal 101 by vapor growth and use this laminated mass as a substrate 101. Further, the N-type impurity used with the GaP device of this invention is not limited to tellurium, but may consist of, for example, sulfur or selenium. Referring again to FIG. 11, the phospho-silicate glass layer 105 was used as a mask, but application of said layer may be omitted. In FIG. 11, the noncrystalline silicon layers 106, 107 were formed by vacuum evaporation, but may be provided by other processes, for example, chemical vapor deposition (C.V.D.).

All the foregoing embodiments referred to a green light emitting GaP device of this invention. However, the invention is also applicable to a red light emitting GaP device. Namely, a GaP device according to the invention wherein zinc and oxygen are disposed in the upper portion of an N-type GaP substrate free from nitrogen to form a P-type GaP layer, thereby providing a P-N junction can distinctly emit a red light due to the luminescent center of a red light, namely, Zn—O pairs being in those portions of the P-type GaP layer which are located near the P-N junction. A red light emitting GaP device which does not contain a light absorbing layer prepared from noncrystalline or polycrystalline silicon allows light to be reflected many times within the GaP crystal as in the green light emitting GaP device which is neither provided with said light absorbing silicon layer, but prevents the red light produced from being deteriorated due to light having shorter wave lengths being absorbed as in the green light emitting GaP device. At any rate, application of a light absorbing layer prepared from noncrystalline or polycrystalline silicon improves a contrast between the light emitting and non-light emitting regions of a GaP device whether it is designed to send forth a green or red light, thus presenting a clear light pattern. In the case, however, where digits are to be displayed in a red light, it is preferred that the light absorbing silicon layer be formed to a larger thickness than in indicating digits in a green light.

What we claim is:

1. A pure-green light-emitting gallium phosphide device comprising a gallium phosphide substrate of N-conductive type doped with nitrogen, a gallium phosphide layer of P-conductive type formed on one side of said substrate so as to define a P-N junction and having at least one light-emitting region, and a light-absorbing and light-reflection-suppressing layer made of noncrystalline or polycrystalline silicon and mounted on the other side of said substrate so as to absorb a portion of the incident light from said substrate and to suppress reflection of the incident light in the interface between said silicon layer and said substrate.

2. The pure-green light-emitting gallium phosphide device according to claim 1 wherein the light-absorbing and light-reflection-suppressing layer made of noncrystalline or polycrystalline silicon is deposited to a thickness of 0.3 to 2.0 microns.

3. The pure-green light-emitting gallium phosphide device according to claim 1 wherein said gallium phosphide layer includes a plurality of light-emitting regions which are separated from one another by portions of the substrate.

4. The pure-green light-emitting gallium phosphide device according to claim 3, which further includes a plurality of light-absorbing layers made of noncrystalline or polycrystalline silicon and mounted on the portions of the substrate between the light-emitting layers.

5. The pure-green light-emitting gallium phosphide device according to claim 1 wherein said substrate is mesa-shaped.

6. The pure-green light-emitting gallium phosphide device according to claim 1 wherein said gallium phosphide device according to claim 1 wherein said gallium phosphide layer includes a plurality of mesa-shaped, divided regions and further including a plurality of light-absorbing layers made of noncrystalline or polycrystalline silicon deposited on some of said divided regions.

7. The pure-green light-emitting gallium phosphide device according to claim 6 which further includes a plurality of electrodes mounted on the divided regions on which the light-absorbing layers are not formed.

8. The pure-green light-emitting gallium phosphide device according to claim 7 which includes another electrode mounted on the light-absorbing and light-reflection-suppressing layer contacted with the substrate.

9. The pure-green light-emitting gallium phosphide device according to claim 1 which further includes an electrode mounted on the light-absorbing and light-reflection-suppressing layer contacted with the substrate.

* * * * *